United States Patent
Ausschnitt et al.

(10) Patent No.: US 9,411,249 B2
(45) Date of Patent: Aug. 9, 2016

(54) DIFFERENTIAL DOSE AND FOCUS MONITOR

(71) Applicant: GLOBALFOUNDRIES INC., Grand Cayman (KY)

(72) Inventors: Christopher P. Ausschnitt, Naples, FL (US); Timothy A. Brunner, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 272 days.

(21) Appl. No.: 14/033,593

(22) Filed: Sep. 23, 2013

(65) Prior Publication Data

US 2015/0085266 A1    Mar. 26, 2015

(51) Int. Cl.
| | |
|---|---|
| *G01B 9/00* | (2006.01) |
| *G03B 27/32* | (2006.01) |
| *G03B 27/52* | (2006.01) |
| *G03C 5/00* | (2006.01) |
| *G03F 7/20* | (2006.01) |
| *G03F 9/00* | (2006.01) |

(52) U.S. Cl.
CPC ........ *G03F 7/70641* (2013.01); *G03F 7/70625* (2013.01); *G03F 7/70683* (2013.01); *G03F 9/7026* (2013.01)

(58) Field of Classification Search
CPC .... G01J 1/42; G03F 7/70616; G03F 7/70625; G03F 7/70641; G03F 7/70683; G03F 9/7026; G03F 9/7076
USPC .............. 355/55, 61, 77; 356/125; 430/22, 30
See application file for complete search history.

(56) References Cited

U.S. PATENT DOCUMENTS

| | | | |
|---|---|---|---|
| 5,300,786 | A | 4/1994 | Brunner et al. |
| 5,508,803 | A | 4/1996 | Hibbs et al. |
| 5,673,103 | A | 9/1997 | Inoue et al. |

(Continued)

FOREIGN PATENT DOCUMENTS

| | | | |
|---|---|---|---|
| CN | 1782867 A | 6/2006 | |
| CN | 101561633 A | 10/2009 | |

(Continued)

OTHER PUBLICATIONS

Ausschnitt, C.P. et al., "Blossom Overlay Metrology Implementation" Proc. of SPIE: Metrology, Inspection, and Process Control for Microlithography XXI (Apr. 5, 2007) pp. 65180G-1-65180G-6, vol. 6518.

(Continued)

*Primary Examiner* — Colin Kreutzer
(74) *Attorney, Agent, or Firm* — Scully Scott Murphy and Presser

(57) ABSTRACT

A dose and focus monitor structure includes at least one complementary set of unit dose monitors and at least one complementary set of unit focus monitors. Each complementary set of unit dose monitors generate edges on a photoresist layer such that the edges move in opposite directions as a function of a dose offset. Each complementary set of unit focus monitors generates edges on the photoresist layer such that the edges move in opposite directions as a function of a focus offset. The dose and focus monitor structure generates self-compensating differential measurements of the dose offset and the focus offset such that the dose offset measurement and the focus offset measurement are independent of each other.

18 Claims, 15 Drawing Sheets

(56) References Cited

U.S. PATENT DOCUMENTS

| | | |
|---|---|---|
| 5,936,738 A | 8/1999 | Liebmann et al. |
| 5,952,160 A | 9/1999 | Bakeman, Jr. et al. |
| 5,965,309 A | 10/1999 | Ausschnitt et al. |
| 5,976,740 A | 11/1999 | Ausschnitt et al. |
| 6,057,908 A | 5/2000 | Ota |
| 6,063,531 A | 5/2000 | Singh et al. |
| 6,440,616 B1 | 8/2002 | Izuha et al. |
| 6,674,511 B2 | 1/2004 | Nomura et al. |
| 6,710,853 B1 | 3/2004 | La Fontaine et al. |
| 6,811,939 B2 | 11/2004 | Nakao et al. |
| 6,974,653 B2 | 12/2005 | Leung et al. |
| 7,042,551 B2 | 5/2006 | Ausschnitt |
| 7,108,945 B2 | 9/2006 | Sutani et al. |
| 7,175,945 B2 | 2/2007 | Mieher et al. |
| 7,250,235 B2 | 7/2007 | Izuha et al. |
| 7,371,483 B2 | 5/2008 | Kanamitsu et al. |
| 7,382,447 B2 | 6/2008 | Mieher et al. |
| 7,532,307 B2 | 5/2009 | Van Der Schaar et al. |
| 7,585,601 B2 | 9/2009 | Brunner et al. |
| 7,651,821 B2 | 1/2010 | Tyrrell et al. |
| 7,678,516 B2 | 3/2010 | Monahan et al. |
| 7,824,829 B2 | 11/2010 | Choi |
| 7,840,932 B2 | 11/2010 | Choi |
| 7,855,037 B2 | 12/2010 | Kim |
| 7,864,294 B2 | 1/2011 | Wang et al. |
| 8,313,877 B2 | 11/2012 | Chung |
| 8,407,632 B2 | 3/2013 | Elfadel et al. |
| 2001/0012098 A1 | 8/2001 | Mishima |
| 2003/0133099 A1 | 7/2003 | Shiode |
| 2005/0208391 A1 | 9/2005 | Mieher et al. |
| 2008/0180647 A1 | 7/2008 | Sugino |
| 2009/0268182 A1* | 10/2009 | Staals .............. G03B 27/32 355/53 |

FOREIGN PATENT DOCUMENTS

| | | |
|---|---|---|
| JP | 2002-151377 A | 5/2002 |
| WO | 2010130600 A1 | 11/2010 |

OTHER PUBLICATIONS

Ausschnitt, C.P. et al., "Multi-layer Overlay Metrology" Proc. of SPIE: Metrology, Inspection, and Process Control for Microlithography XX (Mar. 24, 2006) pp. 615210-1-615210-10, vol. 6152.

Ausschnitt, C.P. et al., "Multi-Patterning Overlay Control" Proc. of SPIE: Optical Microlithography XXI (Mar. 7, 2008) pp. 692448-1-692448-5 692448, vol. 6924.

Hotta, Shoji, et al., "Dose-focus monitor technique using CD-SEM and application to local variation analysis" Advanced Lithography 2012 (Feb. 13, 2012) pp. 8324-04.

Peng, Y. et al., "High Performance Source Optimization Using a Gradient-based Method in Optical Lithography" IEEE 11th International Symposium on Quality Electronic Design (Mar. 22-24, 2010) pp. 108-113.

Starikov, "Exposure Monitor Structure" Proc. of SPIE: Integrated Circuit Metrology, Inspection, and Process Control, IV (Jun. 1, 1990) pp. 315-324, 10 pages, vol. 1261.

Tirapu-Azpiroz, J. et al. "Boundary Layer Model to Account for Thick Mask Effects in Photolithography" Proceedings of the SPIE Optical Microlithography XVI (Feb. 23, 2003) pp. 1611-1619, vol. 5040.

* cited by examiner

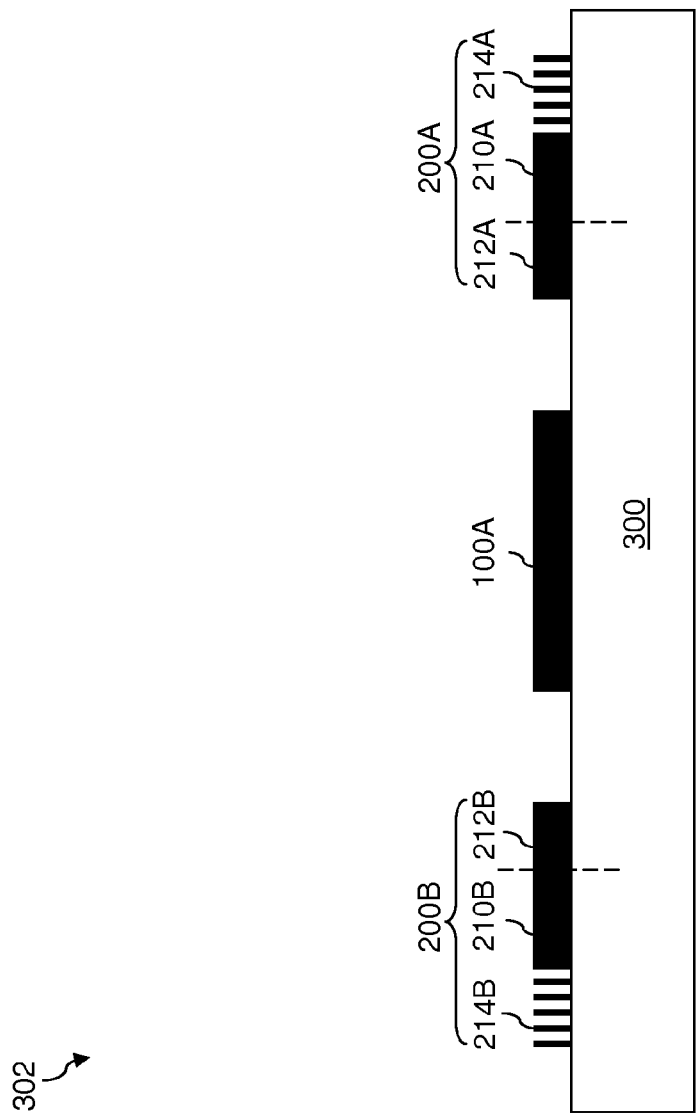

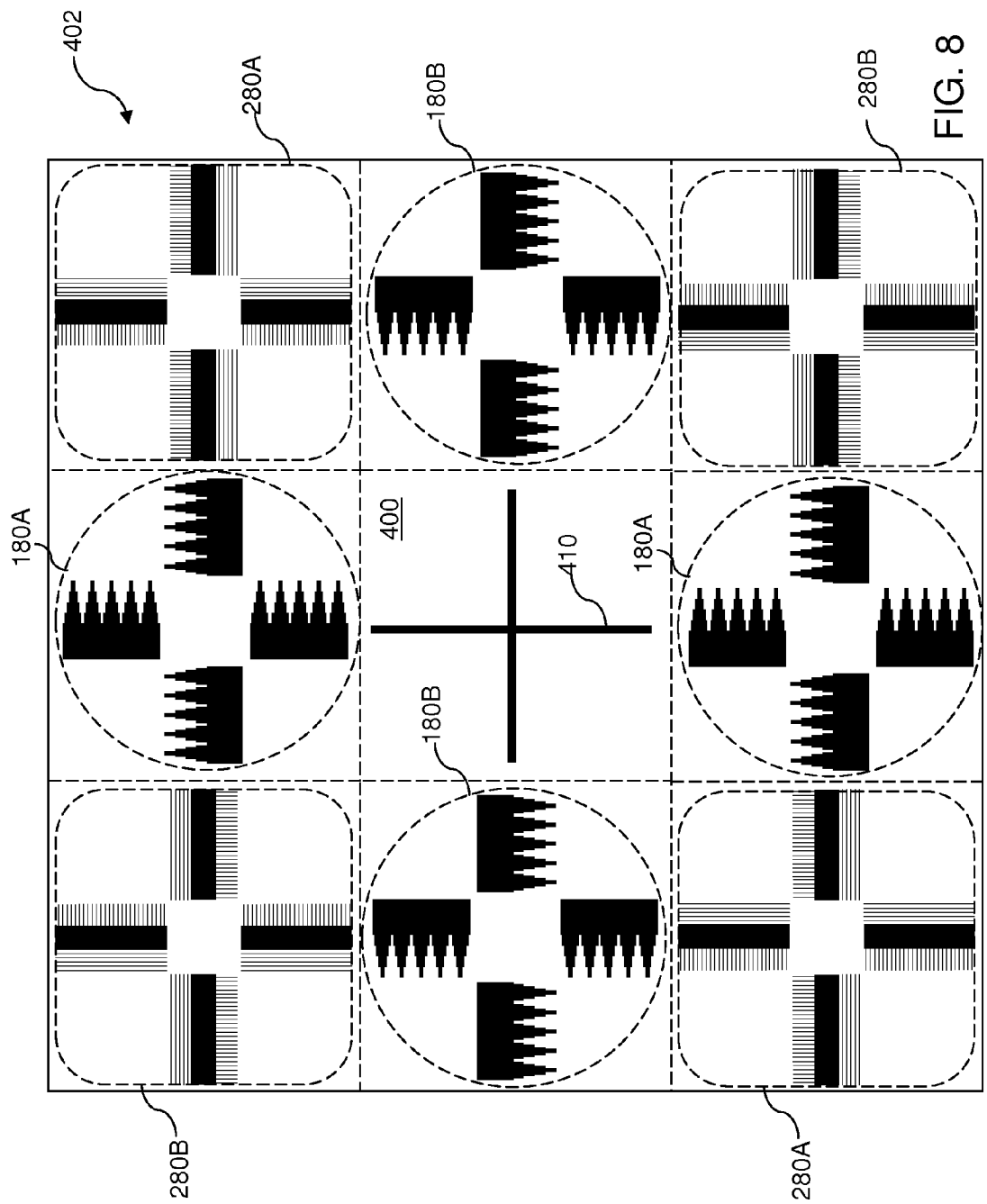

DIFFERENTIAL DOSE AND FOCUS MONITOR

RELATED APPLICATIONS

The present application is related to U.S. patent application Ser. No. 13/608,455 filed on Sep. 10, 2012, the entire contents of which are incorporated herein by reference.

BACKGROUND

The present disclosure relates to metrology methods for measuring dose and focus variations during lithographic exposure of a photoresist, and reticles including a pattern for implementing the same.

A reticle, or a lithographic mask, comprises a transparent reticle substrate and a patterned optically opaque coating thereupon. Alternatively, a photomask may comprise a transparent reticle substrate with a partially transmissive layer, or with features etched out of the substrate to achieve optical phase shifting by changing the optical path length. The reticle is mounted into an exposure tool, which may be integrated into a tool called a scanner, so that radiation from a source of the exposure tool passes through the reticle and impinges on a photoresist applied to a top surface of a semiconductor substrate. The pattern of the reticle is thus transferred into the photoresist during the exposure so that the photoresist may have the same pattern as the pattern of the reticle after development. The reticle may be repeatedly employed to replicate the pattern in the reticle in the photoresist material on multiple semiconductor substrates. The coating on the reticle is optically opaque at the wavelength of the radiation source. Typical wavelengths of radiation that are employed for photolithography include 365 nm, 248 nm, 193 nm, 157 nm, etc. Such deep ultraviolet (DUV) wavelengths may be employed to pattern features having dimensions of 20 nm or greater in the photoresist.

In order to replicate the pattern of the reticles in a photoresist layer on a substrate with high fidelity, it is necessary that the distance between the lens of the exposure tool and the photoresist layer on the substrate be maintained at an optimal value, which is referred to as an optimal focus. A deviation of the distance between the lens of the exposure tool and the photoresist layer is referred to as a focus offset. Any non-zero value of the focus offset degrades the quality of the lithographic pattern formed in the photoresist layer by photographic exposure and development. The tolerance for the focus offset for forming a usable lithographic image is referred to as a depth of focus (DOF). The greater the DOF, the more immune a lithographic process employing a combination of an exposure tool and a reticle is to variations in the distance between the lens of the exposure tool and the photoresist layer, i.e., to the focus offset.

DOF has been continually decreasing with each generation of semiconductor technology. In order to provide high yield lithographic processes, therefore, it is necessary to ensure that the distance between the lens of the exposure tool and the photoresist layer on the substrate be maintained at the optimal focus. In order to provide timely correction to any focus deviation, it is necessary to detect any focus offset from the optimal focus in an efficient manner.

Further, high fidelity replication of the pattern of the reticles in a photoresist layer requires that the lithographic dose employed to lithographically expose the photoresist layer be maintained at an optimal value, which is referred to as an optimal dose. A deviation of the exposure dose from an optimal dose is referred to as a dose offset. Any non-zero value of the dose offset degrades the quality of the lithographic pattern formed in the photoresist layer by photographic exposure and development. Thus, in order to provide high yield lithographic processes, it is necessary to ensure that the dose of lithographic exposure process be maintained at the optimal dose. In order to provide timely correction to any dose deviation, it is necessary to detect any dose offset from the optimal dose in an efficient manner.

SUMMARY

A dose and focus monitor structure includes at least one complementary set of unit dose monitors and at least one complementary set of unit focus monitors. Each complementary set of unit dose monitors generate edges on a photoresist layer such that the edges move in opposite directions as a function of a dose offset. Each complementary set of unit focus monitors generates edges on the photoresist layer such that the edges move in opposite directions as a function of a focus offset. The dose and focus monitor structure generates self-compensating differential measurements of the dose offset and the focus offset such that the dose offset measurement and the focus offset measurement are independent of each other.

According to an aspect of the present disclosure, a reticle including a dose and focus monitor structure is provided. The dose and focus monitor structure includes at least one pair of unit dose monitors configured to print a first pair of printed shapes on a photoresist layer, upon lithographic exposure and development of the photoresist layer, the first pair of first printed shapes moving in opposite directions from positions corresponding to a nominal dose by a first offset distance that is proportional to a dose offset from the nominal dose. The dose and focus monitor structure further includes at least one pair of unit focus monitors configured to print a second pair of printed shapes on the photoresist layer, upon lithographic exposure and development of the photoresist layer, the second pair of second printed shapes moving in opposite directions from positions corresponding to a nominal focus by a second offset distance that is proportional to a focus offset from the nominal focus.

According to another aspect of the present disclosure, a method of monitoring a dose and focus of a lithographic process is provided. A photoresist layer on a substrate is lithographically exposed and developed employing a reticle. The reticle includes a dose and focus monitor structure, which includes at least one pair of dose monitors configured to print a first pair of edges on a photoresist layer, upon lithographic exposure and development of the photoresist layer, the first pair of edges moving in opposite directions from positions corresponding to a nominal dose by a first offset distance that is proportional to a dose offset from the nominal dose. The dose and focus monitor structure further includes at least one pair of focus monitors configured to print a second pair of edges on the photoresist layer, upon lithographic exposure and development of the photoresist layer, the second pair of edges moving in opposite directions from positions corresponding to a nominal focus by a second offset distance that is proportional to a focus offset from the nominal focus. The first offset distance and the second offset distance are measured from patterns in the lithographically exposed and developed photoresist layer. The dose offset and the focus offset are determined from the first offset distance and the second offset distance.

BRIEF DESCRIPTION OF THE SEVERAL VIEWS OF THE DRAWINGS

FIG. 1B is a vertical cross-sectional view of the first exemplary dose and focus monitor structure on the reticle of FIG. 1A according to the first embodiment of the present disclosure.

FIG. 8 is a top-down view of a second exemplary dose and focus monitor structure on a reticle according to the second embodiment of the present disclosure.

DETAILED DESCRIPTION

Figure 1A:
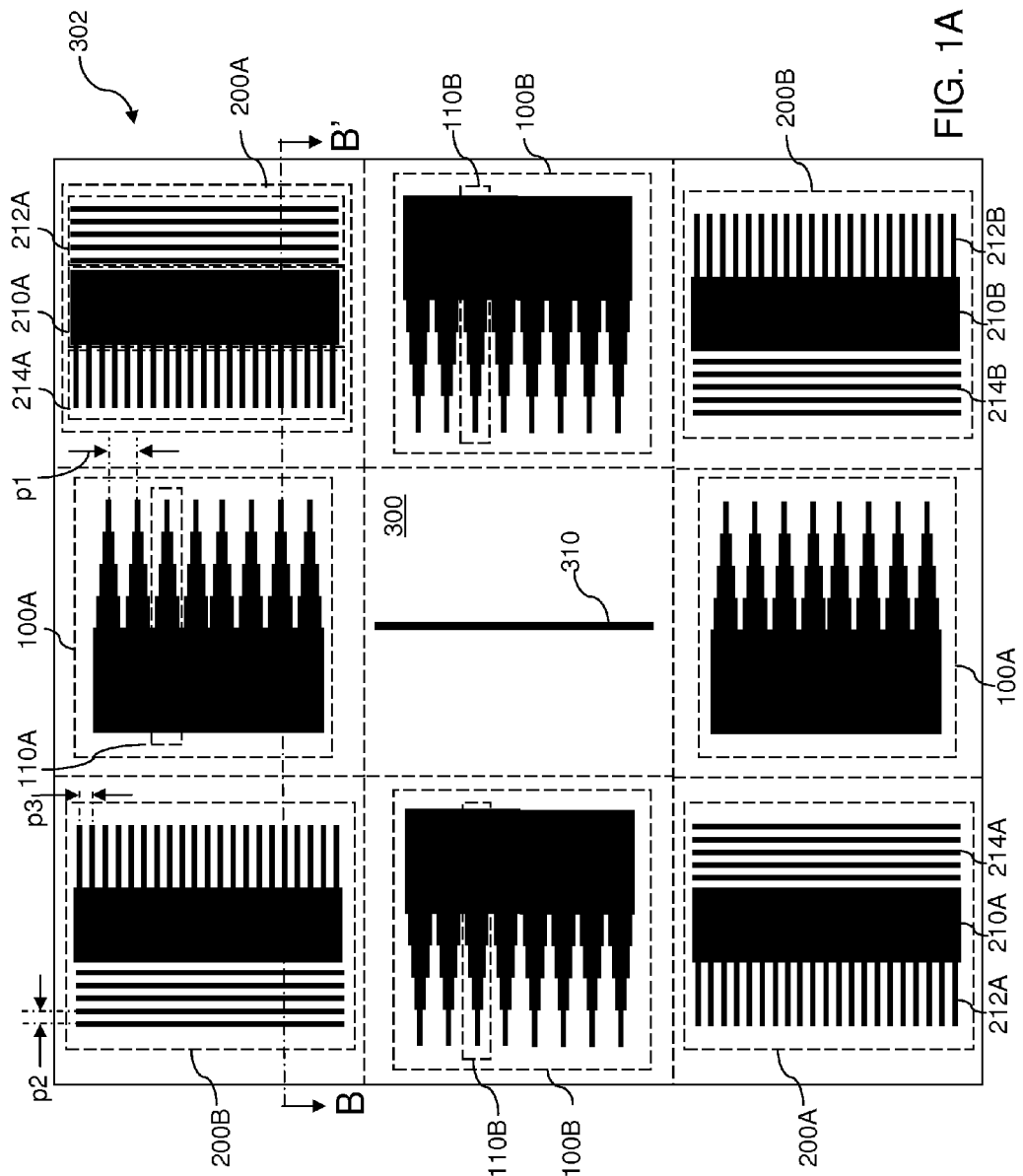
FIG. 1A is a top-down view of a first exemplary dose and focus monitor structure on a reticle according to a first embodiment of the present disclosure.

As stated above, the present disclosure relates to metrology methods for measuring dose and focus variations during lithographic exposure of a photoresist, and reticles including a pattern for implementing the same. Aspects of the present disclosure are now described in detail with accompanying figures. Throughout the drawings, the same reference numerals or letters are used to designate like or equivalent elements. The drawings are not necessarily drawn to scale.

Referring to FIGS. 1A and 1B, a first exemplary dose and focus monitor structure 302 is shown. The first exemplary dose and focus monitor structure 302 can be a portion of a reticle, which is a lithographic mask through which electromagnetic radiation can pass through to generate images of the pattern in the lithographic mask. Once the reticle and a substrate coated with a suitable photoresist layer are mounted onto a lithographic exposure tool, a lithographic pattern replicating the pattern in the reticle can be formed within the photoresist layer on the substrate by lithographic exposure and development of the photoresist layer employing electromagnetic radiation that passes through the reticle and optical components for focusing the image of the pattern in the reticle onto the photoresist layer. The reticle typically includes patterns for forming devices, which can be, for example, semiconductor devices. The first exemplary dose and focus monitor structure 302 is a subset of the reticle that can be employed to monitor the lithographic exposure conditions within the lithographic exposure tool.

The first exemplary dose and focus monitor structure 302 can be implemented employing a transparent substrate 300 and various opaque patterns that represent lithographic patterns for unit dose monitors and unit focus monitors, or the complement of the lithographic patterns for unit dose monitors and unit focus monitors. Optionally, the first exemplary dose and focus monitor structure 302 can include a reference structure 310 that is configured to be printed at the same location with substantially the same shape irrespective of dose or focus variations. The reference structure 310 can be a line or a cross-shaped structure.

The first exemplary dose and focus monitor structure 302 includes at least one pair of unit dose monitors (100A, 100B) and at least one pair of unit focus monitors (200A, 200B). Each pair of unit dose monitors (100A, 100B) includes a first-type unit dose monitor 100A and a second-type unit dose monitor 100B. Each of the unit dose monitors (100A, 100B) is configured to generate an image, on a lithographically exposed and developed photoresist layer, including an edge that laterally shifts as a function of the lithographic dose employed during the lithographic exposure. The edge can be a linear edge. In one embodiment, each of the unit dose monitors (100A, 100B) can include a set of graded-width structures (110A or 110B) having a monotonically decreasing width and configured to generate a line edge on the photoresist layer such that the line edge shifts as a function of the dose, or as a function of a dose offset from an optimal dose that forms the line edge at a target dose. As used herein, a function is "monotonically decreasing" if, for every pair of values for the variable of the function, the value of the function for a greater value of the variable is not more than the value of the function for a lesser value of the variable. Each first-type unit dose monitor 100A can include a set of first-type graded-width structures 110A having a monotonically decreasing width along a first direction. Each second-type unit dose monitor 100B can include a set of second-type graded-width structures 110B having a monotonically decreasing width along a second direction that is the opposite of the first direction. Any other types of unit dose monitors can be employed provided that each unit dose monitor can produce edges that shift as a function of lithographic dose.

Formation of a linear edge on a printed photoresist layer can be effected by selecting the total width of each set of graded-width structures (110A or 110B) to be a sublithographic dimension. In one embodiment, the set of first-type graded-width structures 110A within each first-type unit dose monitor 100A can be a one dimensional periodic array having a pitch p1, and the set of second-type graded-width structures 110B within each second-type unit dose monitor 100B can be a one dimensional periodic array having the pitch p1. The pitch p1 is herein referred to as a first pitch p1. The lateral dimension (i.e., the width) of each set of graded-width structures (110A or 110B) is the same as the first pitch p1 of the set of first-type graded-width structures 110A within each first-type unit dose monitor 100A, which is the same as the first pitch p1 of the set of second-type graded-width structures 110B within each second-type unit dose monitor 100B. If the first pitch p1 is less than a critical dimension given by $$\frac{0.5\lambda}{NA},$$

in which λ is the wavelength of the illuminating radiation employed to develop a photoresist layer employing a reticle including the first exemplary dose and focus monitor structure 302, and NA is the lens numerical aperture of the lithographic exposure tool, then the image of each graded width structure (110A, 110B) is a rectangular area in which an edge corresponding to the graded-width regions of the graded-width structures (110A or 110B) is a straight line. A pitch that is less than the critical dimension, $$\frac{0.5\lambda}{NA}$$

is herein referred to as a "sublithographic pitch," the effect of which on unit dose monitors (100A, 100B) is to print a straight edge in a developed photoresist layer. As used herein, a "sublithographic dimension" refers to a dimension less than the critical dimension.

Thus, the "graded-width" portions within each unit dose monitor (100A, 100B) generate a printed edge of which the position linearly moves as a function of the intensity of the radiation, i.e., as a function of the dose of the lithographic exposure process. It is noted that if the first pitch p1 is greater than the critical dimension, $$\frac{0.5\lambda}{NA},$$

the printed image on a developed photoresist layer will reproduce wedge shapes that are present within the unit dose monitor (100A, 100B). By selecting the first pitch p1 to be less than he critical dimension, $$\frac{0.5\lambda}{NA},$$

the fine feature of the width variations within each graded-width structures (110A or 110B) will not be resolved in the printed image, and the printed image will contain a straight edge within the developed photoresist layer.

Each pair of unit focus monitors (200A, 200B) includes a first-type unit focus monitor 200A and a second-type unit focus monitor 200B. Each of the unit focus monitors (200A, 200B) is configured to generate an image, on the lithographically exposed and developed photoresist layer, including an edge that laterally shifts as a function of the lithographic focus employed during the lithographic exposure. The edge can be a linear edge. In one embodiment, each of the unit focus monitors (200A, 200B) can include a combination of a rectangular block (210A or 210B), a first grating (212A or 212B), and a second grating (214A or 214B). The first grating (212A or 212B) includes a set of lines that are parallel to a lengthwise direction of the rectangular block (210A or 210B) and located on one side of the rectangular block (210A or 210B). The second grating (214A or 214B) includes a set of lines that are perpendicular to the lengthwise direction of the rectangular block (210A or 210B) and located on another side of the rectangular block (210A or 210B). Each of the unit focus monitors (200A, 200B) generates a line edge on the photoresist layer such that the line edges corresponding to lengthwise sides of the rectangular block (210A or 210B) shift as a function of the focus, or as a function of a focus offset from an optimal focus that forms the line edge at a target focus. The second-type unit focus monitor 200B can include a mirror image of the image of a first-type unit focus monitor 200A.

Preventing formation of direct images of the first gratings (212A, 212B) and the second gratings (214A, 214B) on a printed photoresist layer can be effected by selecting the pitch of each grating to be a sublithographic dimension. In one embodiment, the first gratings (212A, 212B) can have a second pitch p2 that is a sublithographic dimension, and the second gratings (214A, 214B) can have a third pitch p3 that is a sublithographic dimension. By setting the second pitch p2 and the third pitch p3 to be less than $$\frac{0.5\lambda}{NA},$$

and by selecting a suitable ratio between the dark area and the bright area (e.g., not more than 4) within each grating, the printing of direct images of the first gratings (212A, 212B) and the second gratings (214A, 214B) can be avoided, and the image of each unit focus monitor (200A or 200B) can a single rectangle with straight edges. It is noted that if the second pitch p2 or the third pitch p3 is greater than the critical dimension, direct images of the first gratings (212A, 212B) and/or the second gratings (214A, 214B) may be formed depending on the ratio between the dark area and the bright area within each grating (212A, 212B, 214A, 214B), which is avoided for the purposes of the present disclosure.

Figure 2:
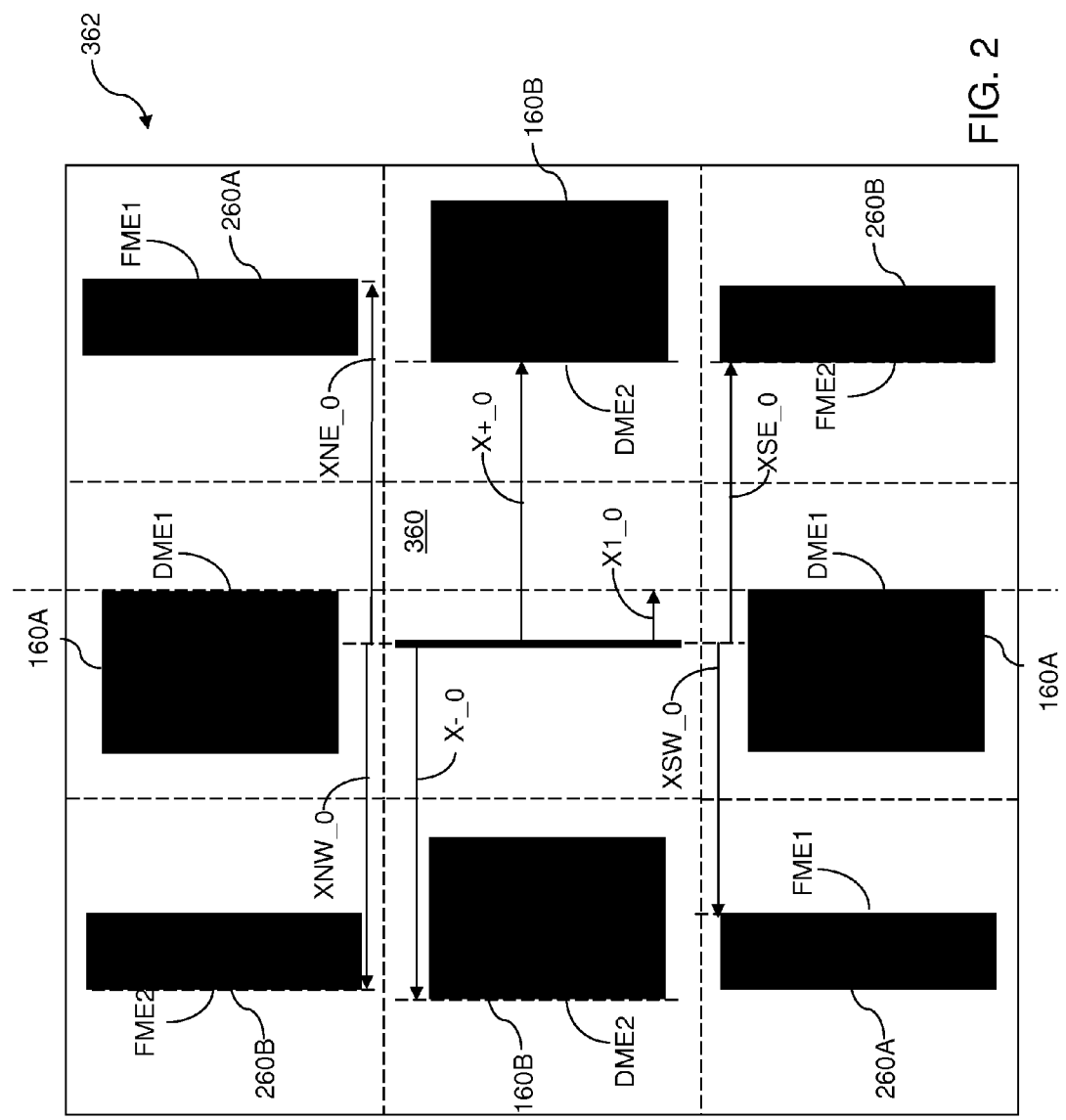
FIG. 2 is a top-down view of a portion of a patterned photoresist layer that has been lithographically exposed and developed employing the first exemplary dose and focus monitor structure at an optimal dose and an optimal focus and subsequently developed according to the first embodiment of the present disclosure.
Figure 3:
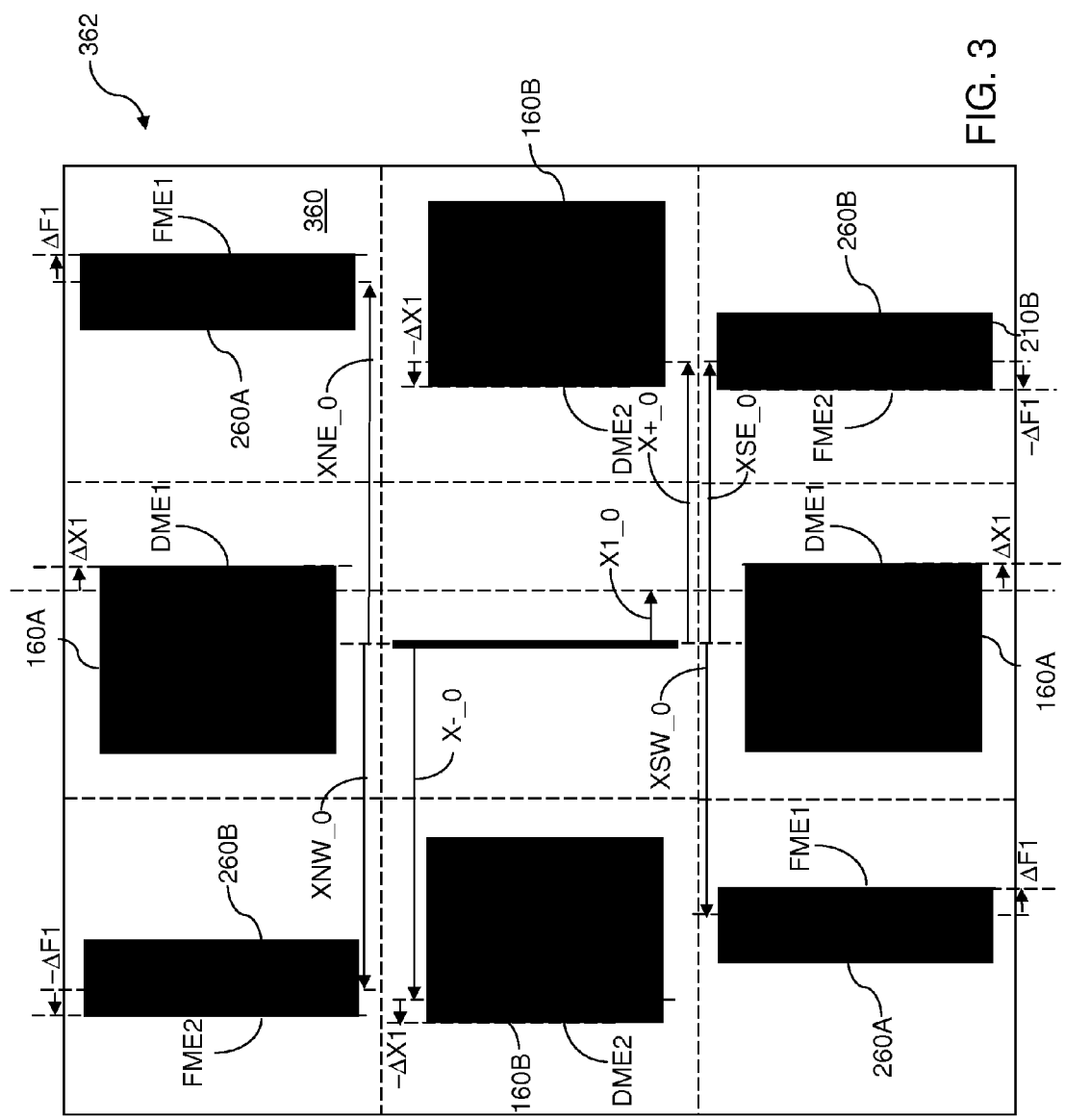
FIG. 3 is a top-down view of a portion of a patterned photoresist layer that has been lithographically exposed and developed employing the first exemplary dose and focus monitor structure with a non-zero dose offset and a non-zero focus offset and subsequently developed according to the first embodiment of the present disclosure.

Referring to FIGS. 2 and 3, patterned photoresist-containing structures 362 include a lithographically exposed and developed photoresist layer on a substrate 360. The lithographically exposed and developed photoresist layer includes various printed shapes that are manifested either by presence of photoresist material, or by absence of photoresist material. The dark regions in FIGS. 2 and 3 may correspond the printed shapes, and thus, may correspond to the presence or absence of the photoresist material depending on the polarity of the reticle and the photoresist material. The patterned photoresist-containing structure 362 in FIG. 2 corresponds to the condition of an optimal dose and an optimal focus, and the patterned photoresist-containing structure 362 in FIG. 3 corresponds to the condition of a non-optimal dose and a non-optimal focus. The photoresist layer includes various patterns physically manifested by presence of a photoresist material portion or absence of a photoresist material portion.

Each region representing the pattern corresponding to each first-type unit dose monitor 100A in a patterned photoresist structure 362 is herein referred to as a first unit dose monitor region 160A, which is defined by presence or absence of a photoresist material with respect to a surrounding region. Each region representing the pattern corresponding to each second-type unit dose monitor 100B in a patterned photoresist structure 362 is herein referred to as a second unit dose monitor region 160B, which is defined by presence or absence of a photoresist material with respect to a surrounding region.

In one embodiment, within each pair of a first unit dose monitor region 160A and a second unit dose monitor region 160B, one edge DME1 of the first unit dose monitor region 160A (which is an edge of the patterned photoresist layer corresponding to the first-type unit dose monitor 100A) and one edge DME2 of the second unit dose monitor region 160B (which is an edge of the patterned photoresist layer corresponding to the second-type unit dose monitor 100B) move in opposite directions as a function of a dose offset from a nominal dose, i.e., a target dose. Such a pair of edges of images of unit dose monitors (100A, 100B) that move in opposite directions is herein referred to as a first pair of edges of the patterned photoresist layer.

The lateral positions of the edges DME1 of the first unit dose monitor regions 160A at the nominal dose are indicated by an optimal first edge position vector X1_0 in FIG. 2. The shift of the lateral positions of the edges DME1 of the first unit dose monitor regions 160A at a non-nominal dose with respect to the end point of the optimal first edge position vector X1_0 is indicated by a first offset distance $\Delta X1$ in FIG. 3. The lateral positions of the edges DME2 of the second unit dose monitor regions 160B at the nominal dose are indicated by an optimal second edge position vectors (X+_0, X−_0) in FIG. 2. The shift of the lateral positions of the edges DME2 of the second unit dose monitor regions 160B at a non-nominal dose with respect to the end points of the corresponding optimal second edge position vectors (X+_0, X−_0) is indicated by the first offset distance $\Delta X1$ in FIG. 3.

Each pair of unit dose monitors (100A, 200A) can be configured to print a first pair of edges (DME1, DME2) on the photoresist layer, upon lithographic exposure and development of the photoresist layer, such that the first pair of edges (DME1, DME2) of the patterned photoresist layer move in opposite directions from positions corresponding to the nominal dose by the first offset distance $\Delta X1$. The first offset distance $\Delta X1$ can be proportional to the dose offset from the nominal dose, and can be positive or negative.

Each region representing the pattern corresponding to each first-type unit focus monitor 200A in a patterned photoresist structure 362 is herein referred to as a first unit focus monitor region 260A, which is defined by presence or absence of a photoresist material with respect to a surrounding region. Each region representing the pattern corresponding to each second-type unit focus monitor 200B in a patterned photoresist structure 362 is herein referred to as a second unit focus monitor region 260B, which is defined by presence or absence of a photoresist material with respect to a surrounding region.

In one embodiment, within each pair of a first unit focus monitor region 260A and a second unit focus monitor region 260B, one edge FME1 of the first unit focus monitor region 260A (which is an edge of the patterned photoresist layer corresponding to the first-type unit focus monitor 200A) and one edge FME2 of the second unit focus monitor region 260B (which is an edge of the patterned photoresist layer corresponding to the second-type unit focus monitor 200B) move in opposite directions as a function of a focus offset from a nominal focus, i.e., a target focus. Such a pair of edges of images of the unit focus monitor regions (260A, 260B) that move in opposite directions is herein referred to as a second pair of edges of the patterned photoresist layer.

The lateral positions of the edges FME1 of the first unit focus monitor regions 260A at the nominal focus are indicated by optimal second edge position vectors (XNE_0, XSW_0) in FIG. 2. The shift of the lateral positions of the edges FME1 of the first unit focus monitor regions 260A at a non-nominal focus with respect to the end point of the corresponding optimal second edge position vectors (XNE_0, XSW_0) is indicated by a second offset distance $\Delta F1$ in FIG. 3. The lateral positions of the edges FME2 of the second unit focus monitor regions 260B at the nominal focus are indicated by an optimal second edge position vectors (XNW_1, XSE_0) in FIG. 2. The shift of the lateral positions of the edges FME2 of the second unit focus monitor regions 260B at a non-nominal focus with respect to the end points of the corresponding optimal second edge position vectors (XNW_1, XSE_0) is indicated by the second offset distance $\Delta F1$ in FIG. 3.

Each pair of unit focus monitors (100A, 200A) can be configured to print a second pair of edges (FME1, FME2) on the photoresist layer, upon lithographic exposure and development of the photoresist layer, such that the second pair of edges (FME1, FME2) of the patterned photoresist layer move in opposite directions from positions corresponding to the nominal focus by the second offset distance $\Delta F1$. The second offset distance $\Delta F1$ can be proportional to the focus offset from the nominal focus, and can be positive or negative.

Thus, the first offset distance $\Delta X1$ and the second offset distance $\Delta F1$ can be measured from patterns in the lithographically exposed and developed photoresist layer in a patterned photoresist structure 362. The dose offset and the focus offset from the optimal dose and the optimal focus, respectively, can be determined from the first offset distance $\Delta X1$ and the second offset distance $\Delta F1$. The lithographic process can be modified to achieve the optimal dose and the optimal focus.

In one embodiment, a pair of unit dose monitors among the at least one pair of unit dose monitors (100A, 100B) can have patterns that are mirror images of each other. In one embodiment, a mirror image axis for generating a pattern that is congruent to one of the pair of unit dose monitors (100A, 100B) from a pattern of another of the pair of unit dose monitors (100A, 100B) can be perpendicular to the direction of the first offset distance $\Delta X1$. For example, the vertical direction within the plane of FIG. 1A can be mirror image axis for generating a pattern congruent to a second-type unit dose monitor 100B from a pattern of a first-type unit dose monitor 100A.

In one embodiment, a pair of unit focus monitors among the at least one pair of unit focus monitors (200A, 200B) can have patterns that are mirror images of each other. In one embodiment, a mirror image axis for generating a pattern that is congruent to one of the pair of unit focus monitors (200A, 200B) from a pattern of another of the pair of unit focus monitors (200A, 200B) can be perpendicular to a direction of the second offset distance $\Delta F1$. For example, the vertical direction within the plane of FIG. 1A can be mirror image axis for generating a pattern congruent to a second-type unit focus monitor 200B from a pattern of a first-type unit dose monitor 200A.

Each pair of unit dose monitors in the first exemplary dose and focus monitor structure can provide a differential measurement because the direction of movement of linear edges in the pair of printed shapes are opposite in the pair of unit dose monitors. Within each pair of unit dose monitors, each unit dose monitor functions as a complementary unit dose monitor with respect to the other unit dose monitor to enable differential measurements. Each pair of unit focus monitors in the first exemplary dose and focus monitor structure can provide a differential measurement because the direction of movement of linear edges in the pair of printed shapes are opposite in the pair of unit focus monitors. Within each pair of unit focus monitors, each unit focus monitor functions as a complementary unit focus monitor with respect to the other unit focus monitor to enable differential measurements.

Figure 4A:
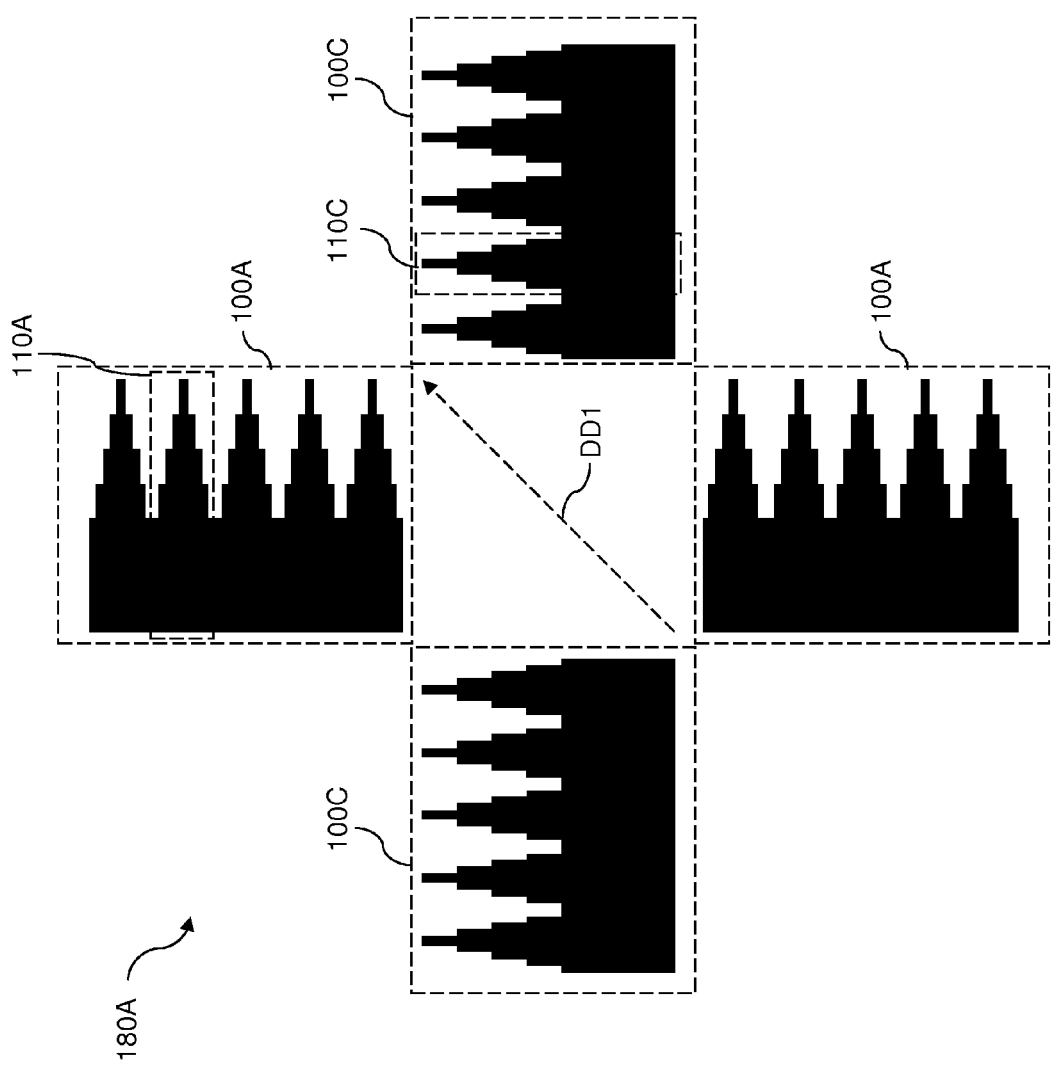
FIG. 4A is a top-down view of a third-type unit dose monitor according to a second embodiment of the present disclosure.

Referring to FIG. 4A, a third-type unit dose monitor 180A according to a second embodiment of the present disclosure is illustrated. The third-type unit dose monitor 180A can include a plurality of sets of graded-width structures (110A or 110C). In one embodiment, the third-type unit dose monitor 180A includes four sets (100A, 100C) of graded-width structures (110A or 100C), and is equivalent to a combination of two instances of first-type unit dose monitors 100A according to the first embodiment of the present disclosure and two instances of a structure 100C derived from a first-type unit dose monitor 100A by a rotation by 90 degrees.

For example, five graded-width structures 110A collectively constitute a set of graded-width structures in each instance of a first-type unit dose monitor 100A. Five graded-width structures 110C collectively constitute another set of graded-width structures in each structure 100C. Each graded-width structure (110A, 110C) has a monotonically decreasing width.

Figure 4B:
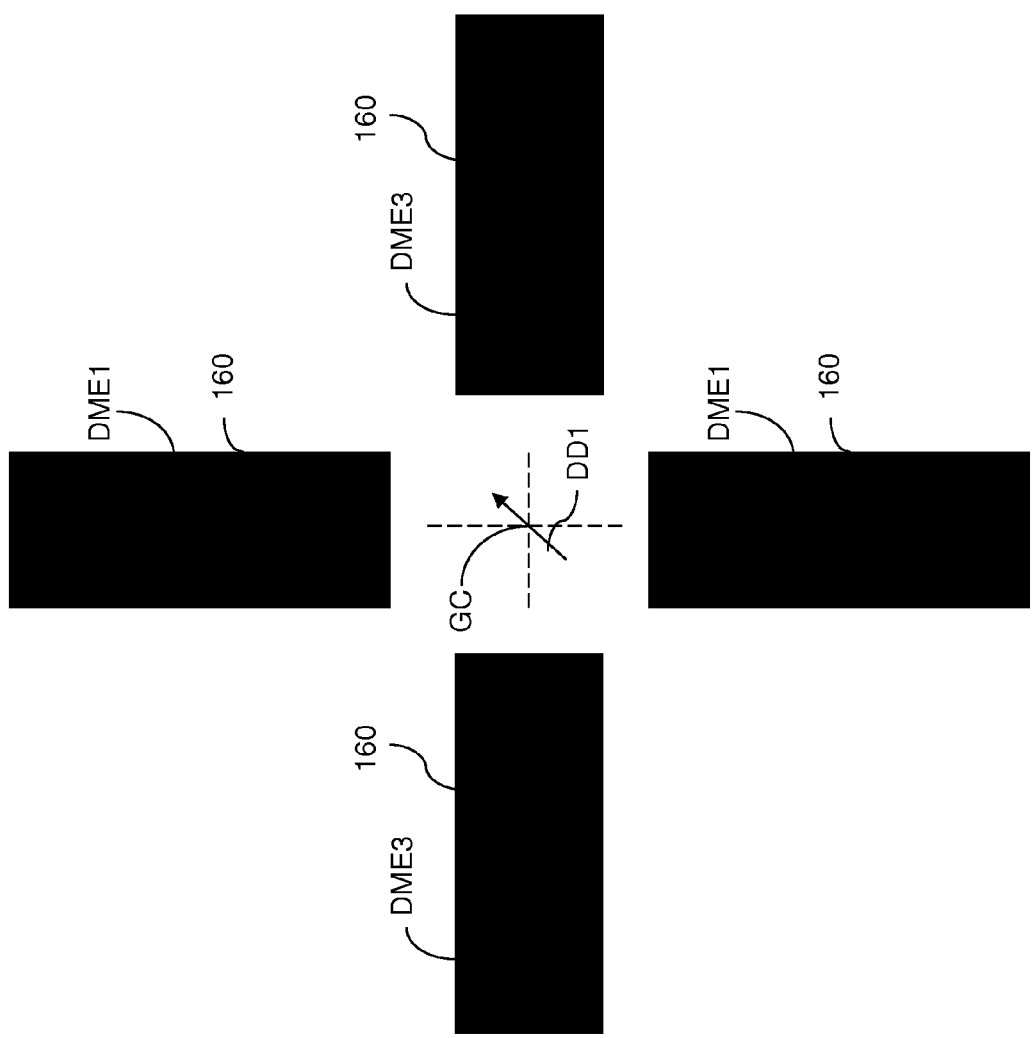
FIG. 4B is a top-down view of a portion of a patterned photoresist layer that has been lithographically exposed and developed employing a reticle including the third-type unit dose monitor according to the second embodiment of the present disclosure.

Referring to FIG. 4B, regions representing the pattern generated in a patterned photoresist structure are shown, which is defined by presence or absence of a photoresist material with respect to a surrounding region. The regions include a plurality of rectangular shapes 160 that include edges (DME1, DME3). Each set (100A, 100C) of graded-width structures (110A, 110C) is configured to generate, on the photoresist layer, a line edge (DME1, DME3) that shifts as a function of the dose offset. The plurality of sets (100A, 100C) of graded-width structures (110A, 110C) within the third-type unit dose monitor 180A can generate, on the photoresist layer, two line edges (DME1, DME3) that are perpendicular to each other. The two line edges (DME1, DME3) shift as a function of the dose offset.

In one embodiment, the third-type unit dose monitor 180A can include four sets (100A, 100C) of graded-width structures (110A, 110C) configured to generate, on the photoresist layer, four rectangular shapes 160. In one embodiment, a geometrical center GC of the four rectangular shapes 160 can move, as a function of a dose of the lithographic process, along a direction that is at a 45 degree angle with respect to lengthwise edges of the four rectangular shapes 160. As used here, a geometrical center GC of regions refers to a point corresponding to the mathematical average of all coordinates of the regions as calculated with equal weighting for all points in the regions. The direction of movement of the geometrical center of the four rectangular shapes 160 is herein referred to as a first dose diagonal direction DD1.

Figure 5A:
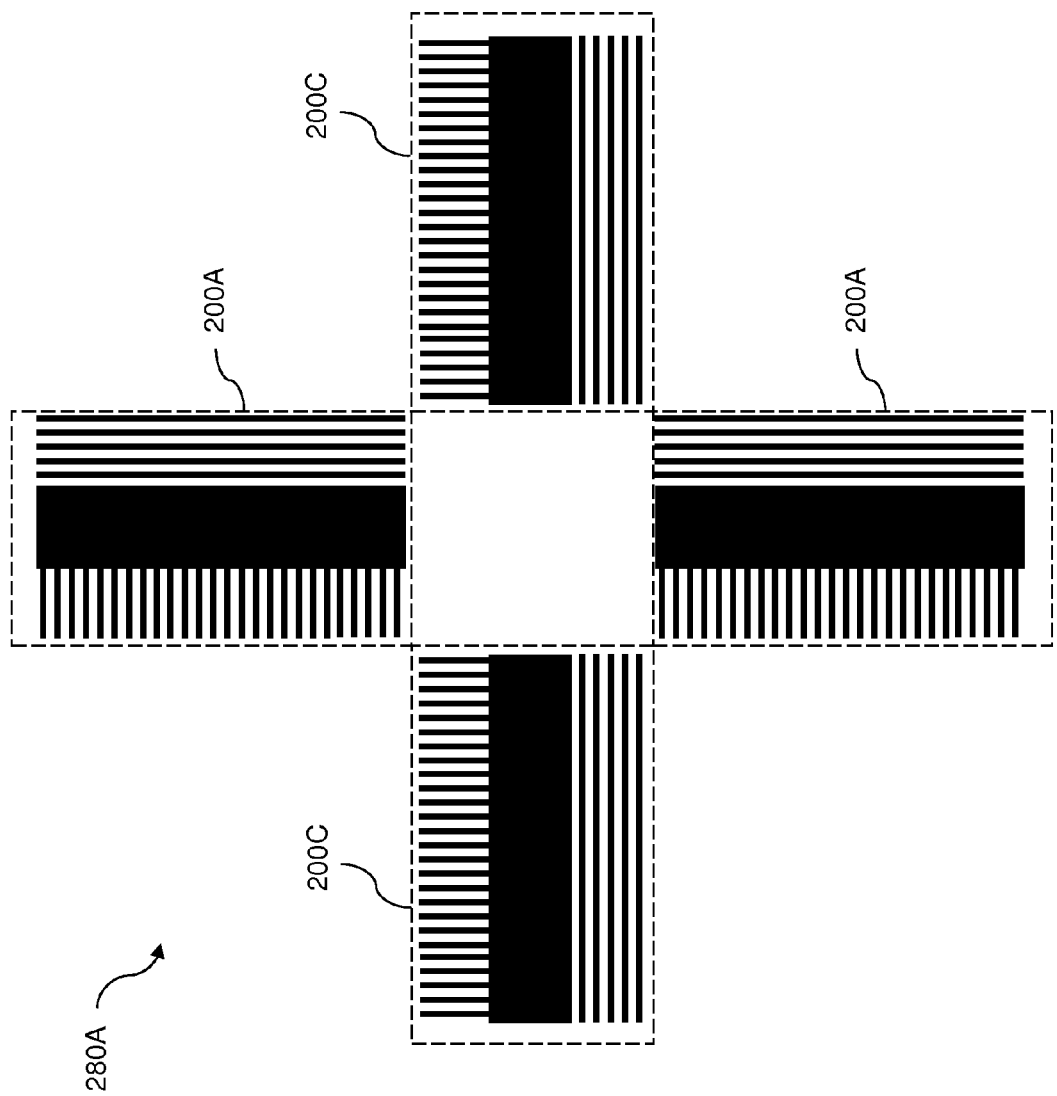
FIG. 5A is a top-down view of a third-type unit focus monitor according to the second embodiment of the present disclosure.

Referring to FIG. 5A, a third-type unit focus monitor 280A according to the second embodiment of the present disclosure includes two instances of a first-type unit focus monitor 200A and two instances of a structure 200C that is derived from the first-type unit focus monitor by a 90 degree rotation in the counterclockwise direction. The third-type unit focus monitor 280A can include four rectangular shapes that form a hollow cross pattern, i.e., a cross pattern with a hollow region at the center.

Figure 5B:
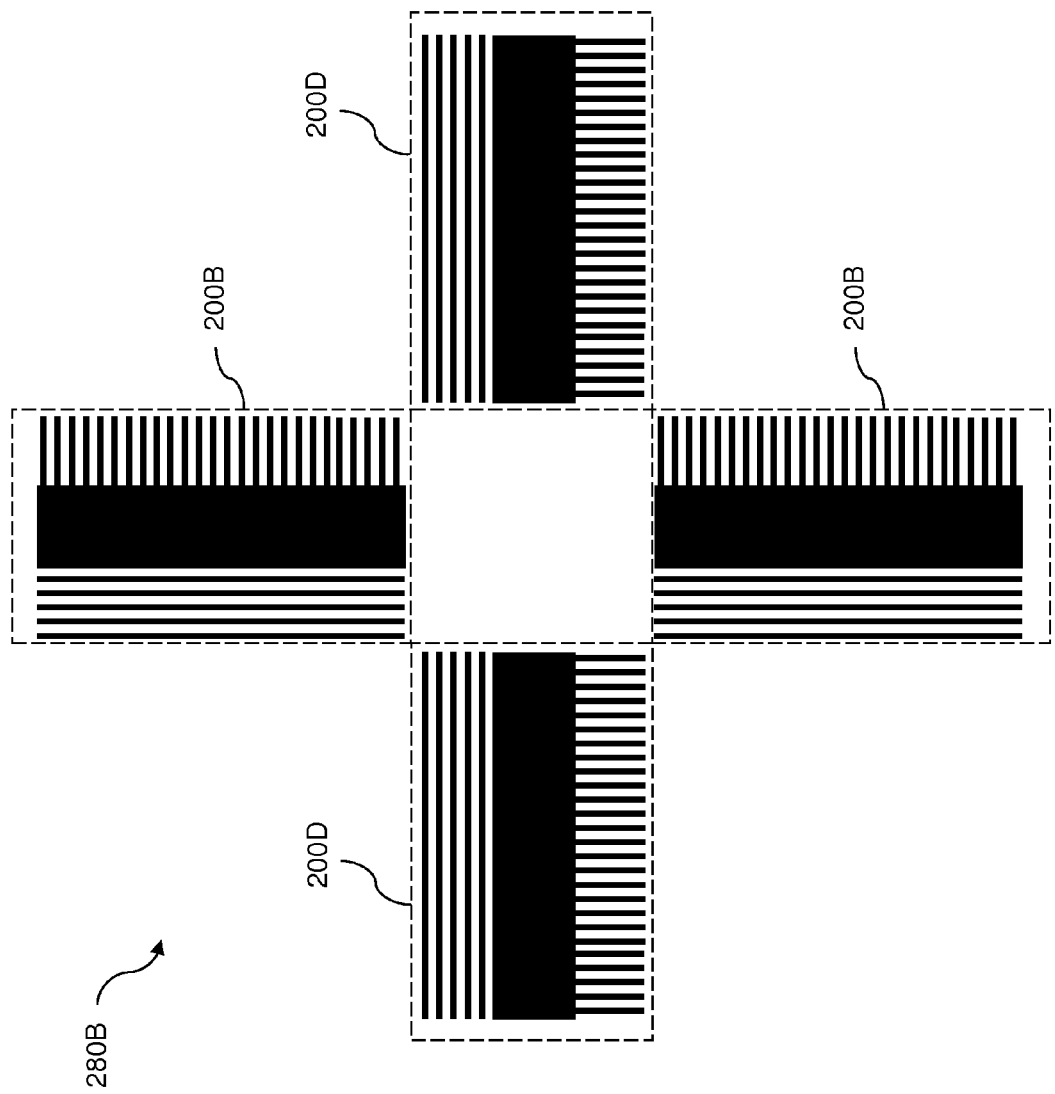
FIG. 5B is a top-down view of a fourth-type unit focus monitor according to the second embodiment of the present disclosure.

Referring to FIG. 5B, a fourth-type unit focus monitor 280B according to the second embodiment of the present disclosure includes two instances of a second-type unit focus monitor 200B and two instances of a structure 200D that is derived from the second-type unit focus monitor 200B by a 90 degree rotation in the counterclockwise direction. The fourth-type unit focus monitor 280B can include four rectangular shapes that form a hollow cross pattern, i.e., a cross pattern with a hollow region at the center.

In each of the third-type and fourth-type unit focus monitors (280A, 280B), a plurality of combinations of shapes are present. In the third-type unit focus monitor 280A, each combination can be an instance of a first-type unit focus monitor 200A or a structure 200C derived from the first-type unit focus monitor 200A by a 90 degree rotation. In the fourth-type unit focus monitor 280B, each combination can be an instance of a second-type unit focus monitor 200B or a structure derived from the second-type unit focus monitor 200B by a 90 degree rotation. Thus, each combination of shapes including a rectangular block, a first grating, and a second grating as in the first embodiment. The first grating includes a set of lines that are parallel to a lengthwise direction of the rectangular block, and is located on one side of the rectangular block. The second grating includes a set of lines that are perpendicular to the lengthwise direction of the rectangular block, and is located on another side of the rectangular block.

Figure 6A:
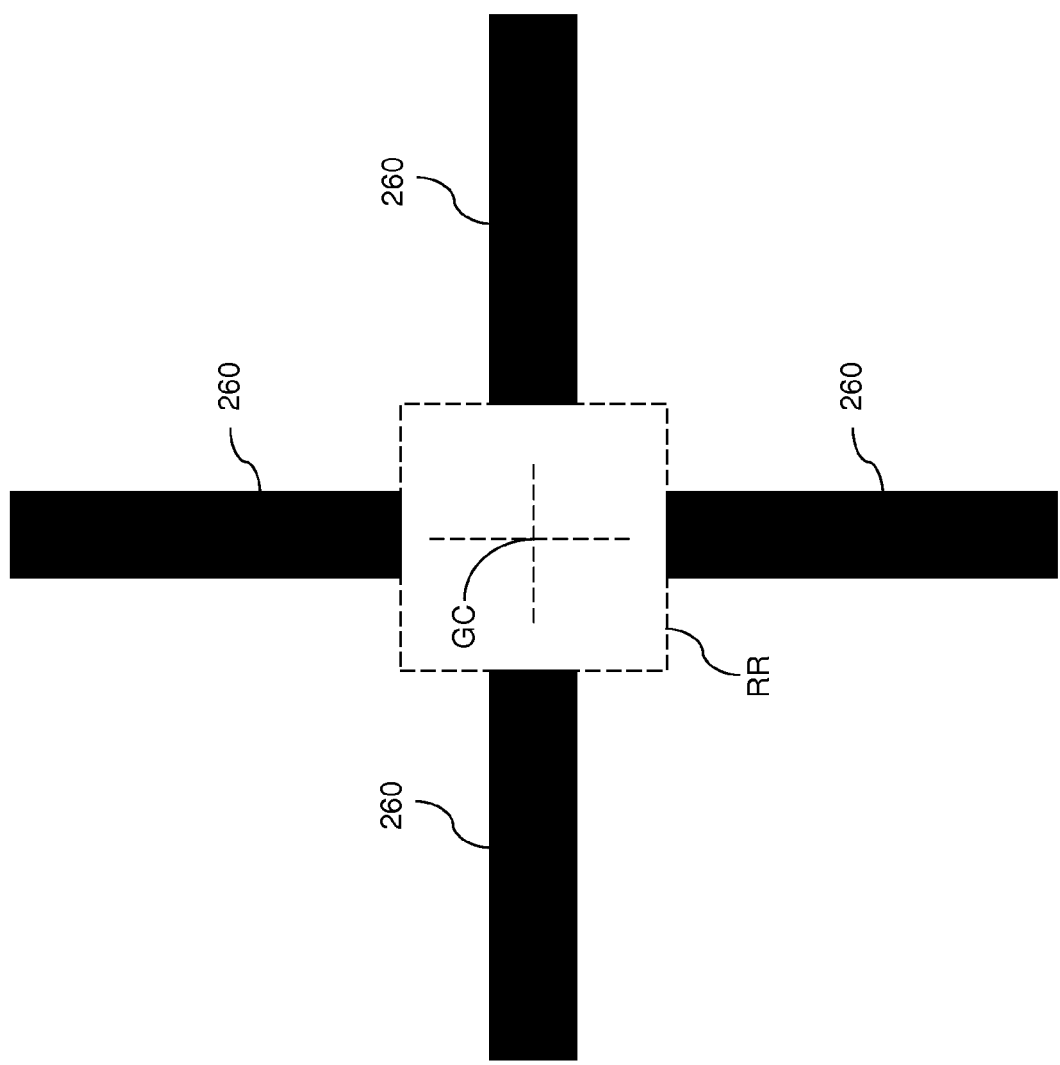
FIG. 6A is a top-down view of a printed image of the third-type unit focus monitor when the focus offset is zero according to the second embodiment of the present disclosure.
Figure 6B:
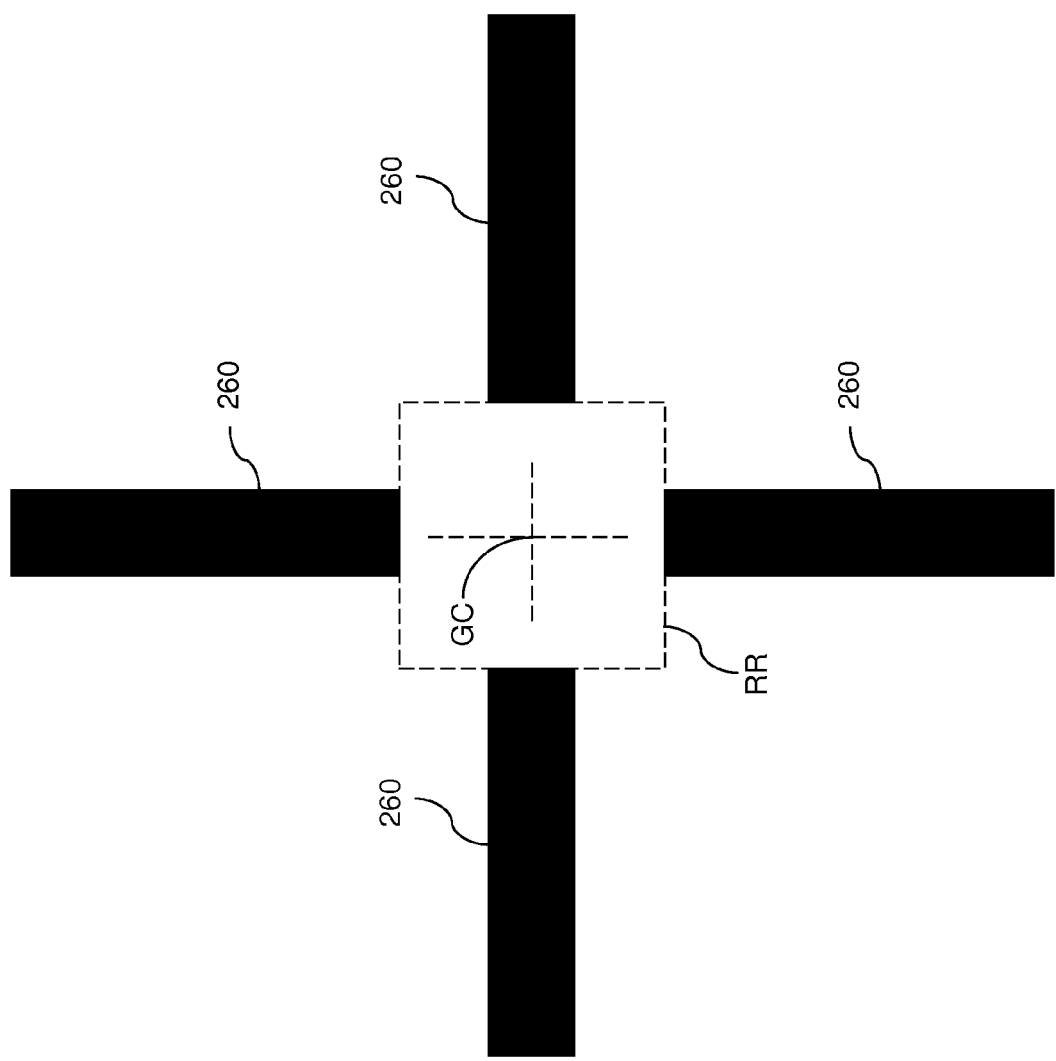
FIG. 6B is a top-down view of a printed image of the fourth-type unit focus monitor when the focus offset is zero according to the second embodiment of the present disclosure.

FIG. 6A shows a printed image of the third-type unit focus monitor 280A when the focus shift is zero. FIG. 6B shows a printed image of the fourth-type unit focus monitor 280B when the focus shift is zero. In each printed image, regions representing the pattern generated in a patterned photoresist structure are shown, which is defined by presence or absence of a photoresist material with respect to a surrounding region. The regions include a plurality of rectangular shapes 260, which can be arranged in a cross pattern including a rectangular region RR within. A geometrical center GC of the plurality of rectangular regions 260 can be located within the rectangular region RR. The rectangular region RR can be defined by a set of four proximal edges of the plurality of rectangular shapes 260. Each of the four proximal edges can be perpendicular to the lengthwise direction of a rectangular shape 260 containing the proximal edge. In one embodiment, each of the third-type and fourth-type unit focus monitors (280A, 280B) can include four combinations of shapes configured to generate, on the photoresist layer, four rectangular shapes 260.

Figure 7A:
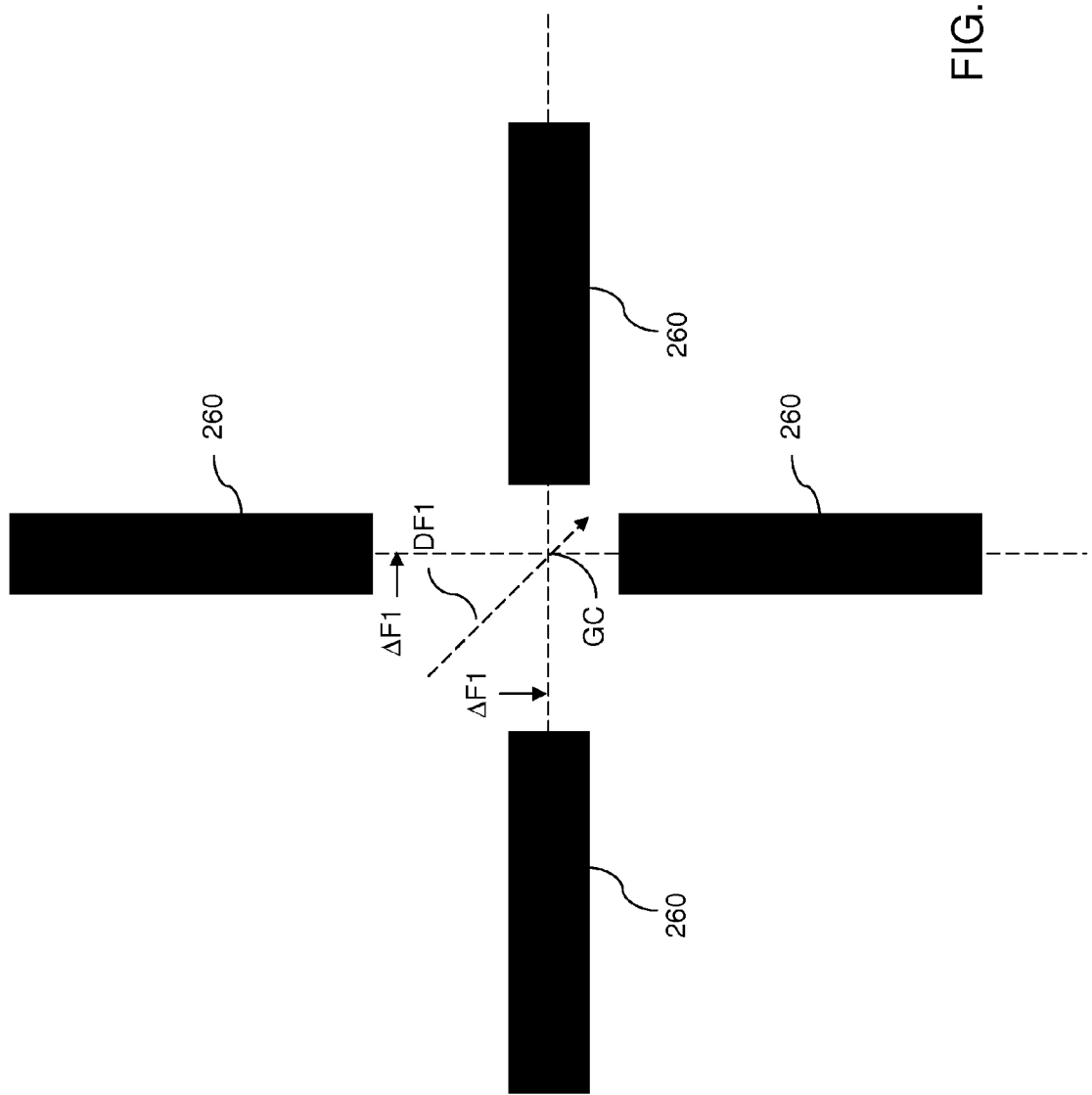
FIG. 7A is a top-down view of a printed image of the third-type unit focus monitor when the focus offset is non-zero according to the second embodiment of the present disclosure.
Figure 7B:
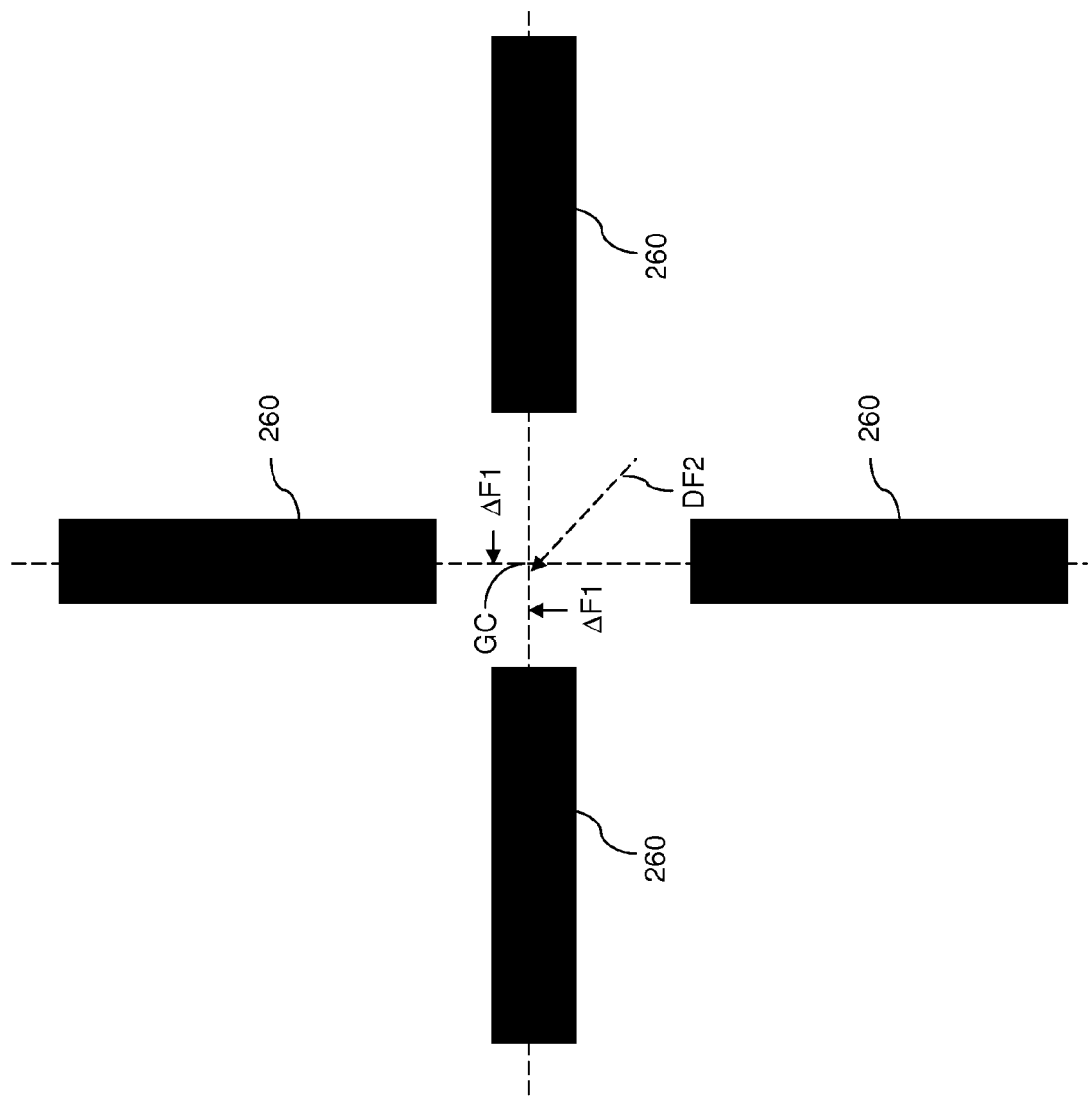
FIG. 7B is a top-down view of a printed image of the fourth-type unit focus monitor when the focus offset is non-zero according to the second embodiment of the present disclosure.

FIG. 7A shows a printed image of the third-type unit focus monitor 280A when the focus shift is non-zero. FIG. 7B shows a printed image of the fourth-type unit focus monitor 280B when the focus shift is non-zero. As in the first embodiment, line edges corresponding to lengthwise sides of the rectangular block shift as a function of the focus offset. Each line edge corresponding to a lengthwise side of the rectangular blocks shifts as a function of the focus offset. For example, the line edges corresponding to a lengthwise side of each rectangular block can shift by a second offset distance $\Delta F1$ in proportion to the focus offset relative to the nominal focus.

In one embodiment, the width of each rectangular shape 260 can be invariant under changes in the focus offset. Thus, a geometrical center GC of the four rectangular shapes 260 moves, as a function of the focus offset and in proportion to the focus offset, by the second offset distance $\Delta F1$ along a first direction that is perpendicular to lengthwise edges of two rectangular shapes 260, and concurrently by the second offset distance ΔF1 along a second direction that is perpendicular to lengthwise edges of the other two rectangular shapes 260. Thus, the geometrical center of the four rectangular shapes 260 can move along a direction that is at a 45 degree angle with respect to lengthwise edges of two of the four rectangular shapes 260.

The third-type unit focus monitor 280A and the fourth-type unit focus monitor 280B can be configured such that the geometrical center GC of the four rectangular shapes 260 in the image of the printed pattern from the third-type unit focus monitor 280A moves along a first focus diagonal direction DF1, and the geometrical center GC of the four rectangular shapes 260 in the image of the printed pattern from the fourth-type unit focus monitor 280B moves along a second focus diagonal direction DF2 that is the opposite of the first focus diagonal direction DF1.

Referring to FIG. 8, a second exemplary dose and focus monitor structure 402 according to the second embodiment of the present disclosure can be implemented employing a transparent substrate 400 and various opaque patterns that represent lithographic patterns for unit dose monitors and unit focus monitors, or the complement of the lithographic patterns for unit dose monitors and unit focus monitors. Optionally, the second exemplary dose and focus monitor structure 402 can include a reference structure 410 that is configured to be printed at the same location with substantially the same printed shape irrespective of dose or focus variations. The reference structure 410 can be a line or a cross-shaped structure.

Figure 9:
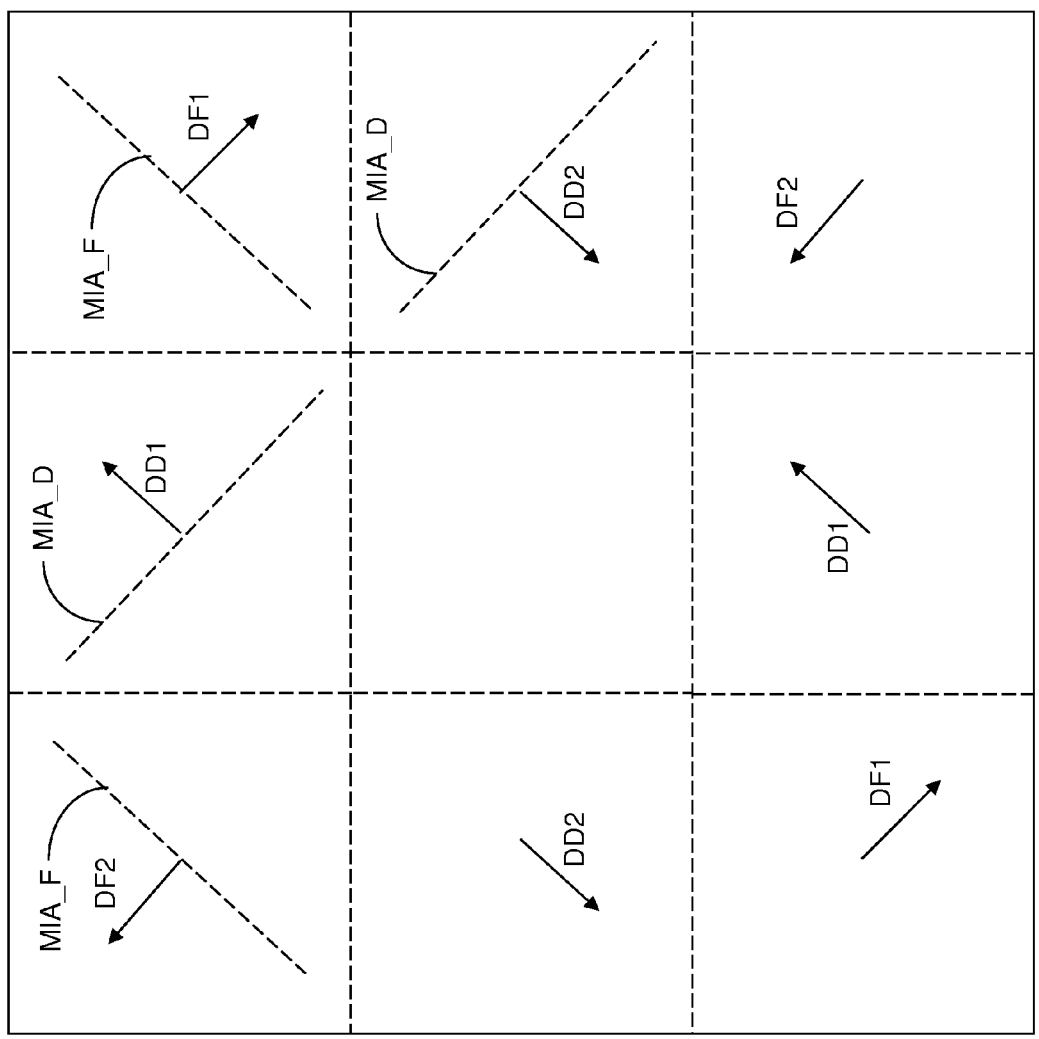
FIG. 9 illustrates directions of movement of images on a photoresist layer as a function of a dose shift and a focus shift for the second exemplary dose and focus monitor structure according to the second embodiment of the present disclosure.

The second exemplary dose and focus monitor structure 402 includes at least one pair of unit dose monitors (180A, 180B) and at least one pair of unit focus monitors (280A, 280B). The at least one pair of unit dose monitors (180A, 180B) can include a third-type unit dose monitor 180A illustrated in FIG. 4A, and a fourth-type unit dose monitor 180B that can be derived from a third-type unit dose monitor 180A by generating a mirror image structure therefrom. The mirror image axis MIA_D that can be employed to generate a fourth-type unit dose monitor 180B from a third-type unit dose monitor 180A is shown in FIG. 9.

Each pair of unit dose monitors (180A, 180B) includes a third-type unit dose monitor 180A and a fourth-type unit dose monitor 180B. Each of the unit dose monitors (180A, 180B) is configured to generate an image, on a lithographically exposed and developed photoresist layer, including edges that laterally shift as a function of the lithographic dose employed during the lithographic exposure. The edges can be linear edges. In one embodiment, each of the unit dose monitors (180A, 180B) can include a set of graded-width structures such as the graded-width structures (110A, 110C) illustrated in FIG. 4A. Each graded-width structure has a monotonically decreasing width, and is configured to generate a line edge on the photoresist layer such that the line edge shifts as a function of the dose, or as a function of a dose offset from an optimal dose that forms the line edge at a target dose. Any other types of unit dose monitors can be employed provided that each unit dose monitor can produce edges that shift as a function of lithographic dose.

The second exemplary dose and focus monitor structure 402 includes at least one pair of unit dose monitors (180A, 180B) and at least one pair of unit focus monitors (280A, 280B). The at least one pair of unit dose monitors (180A, 180B) can include a third-type unit dose monitor 180A illustrated in FIG. 4A, and a fourth-type unit dose monitor 180B that can be derived from a third-type unit dose monitor 180A by generating a mirror image structure therefrom. The mirror image axis MIA_D that can be employed to generate a fourth-type unit dose monitor 180B from a third-type unit dose monitor 180A is shown in FIG. 9.

Each pair of unit focus monitors (280A, 280B) includes a third-type unit focus monitor 280A and a fourth-type unit focus monitor 280B. Each of the unit focus monitors (280A, 280B) is configured to generate an image, on the lithographically exposed and developed photoresist layer, including an edge that laterally shifts as a function of the lithographic focus employed during the lithographic exposure. The edge can be a linear edge. In one embodiment, each of the unit focus monitors (280A, 280B) can include a plurality of combinations of a rectangular block, a first grating, and a second grating as illustrated in FIGS. 5A and 5B. Within each combination, the first grating includes a set of lines that are parallel to a lengthwise direction of the rectangular block and located on one side of the rectangular block. The second grating includes a set of lines that are perpendicular to the lengthwise direction of the rectangular block and located on another side of the rectangular block. Each of the unit focus monitors (280A, 280B) generates line edges on the photoresist layer such that the line edges corresponding to lengthwise sides of the rectangular block (210A or 210B) shift as a function of the focus, or as a function of a focus offset from an optimal focus that forms the line edge at a target focus.

In one embodiment, a pair of unit dose monitors among the at least one pair of unit dose monitors (180A, 180B) can have patterns that are mirror images of each other. In one embodiment, a pair of unit focus monitors among the at least one pair of unit focus monitors (280A, 280B) can have patterns that are mirror images of each other. Referring to FIG. 9, examples of the mirror image axis MIA_D for generating a fourth-type unit dose monitor 180B from a third-type unit dose monitor 180A, or vice versa, are shown. Further, examples of the mirror image axis MIA_F for generating a fourth-type unit focus monitor 280B from a third-type unit focus monitor 280A, or vice versa, are shown.

FIG. 9 also shows directions of movement of images on a photoresist layer as a function of a dose shift during a lithographic exposure process employing the second exemplary dose and focus monitor structure 402. Specifically, the first dose diagonal direction DD1 along which the geometrical center GC (See FIG. 4B) of the printed image of the third-type unit dose monitor 180A (See FIGS. 4A and 8) moves can be perpendicular to the mirror image axis MIA_D for generating a fourth-type unit dose monitor 180B from a third-type unit dose monitor 180A, or vice versa. Likewise, the second dose diagonal direction DD2 along which the geometrical center of the printed image of the fourth-type unit dose monitor 180B (See FIG. 8) moves can be perpendicular to the mirror image axis MIA_D.

In addition, FIG. 9 shows directions of movement of images on a photoresist layer as a function of a focus shift during a lithographic exposure process employing the second exemplary dose and focus monitor structure 402. Specifically, the first focus diagonal direction DF1 along which the geometrical center GC (See FIG. 7A) of the printed image of the third-type unit focus monitor 280A (See FIG. 5A and FIG. 8) moves can be perpendicular to the mirror image axis MIA_F for generating a fourth-type unit focus monitor 280B from a third-type unit focus monitor 280A, or vice versa. Likewise, the second focus diagonal direction DF2 along which the geometrical center GC (See FIG. 7B) of the printed image of the fourth-type unit focus monitor 180B (See FIG. 5B and FIG. 8) moves can be perpendicular to the mirror image axis MIA_F.

Figure 10:
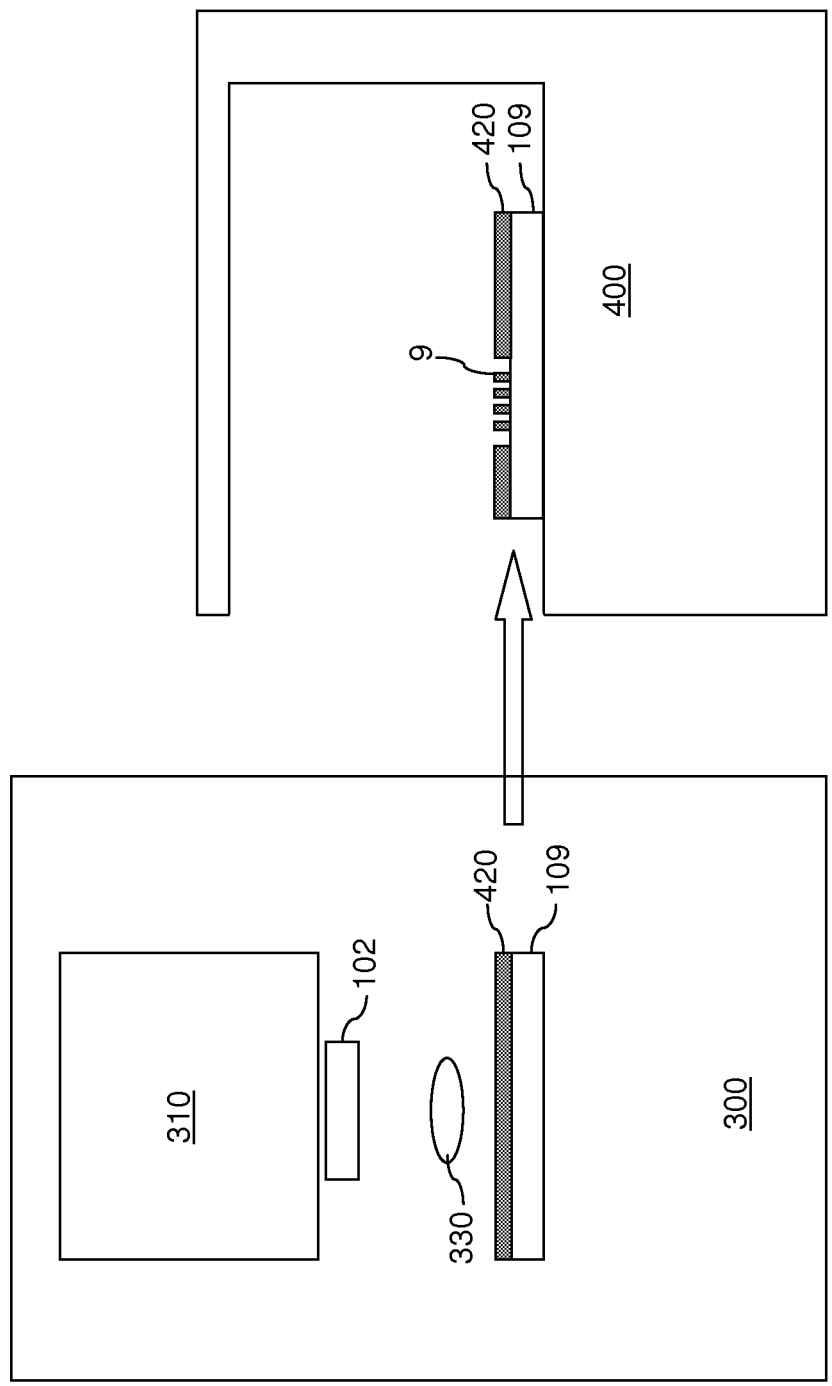
FIG. 10 is a schematic drawing representing the process of lithographic exposure and development and measurement of the shift of the printed image in a metrology tool according to an embodiment of the present disclosure.

Referring to FIG. 10, the process of lithographic exposure and development in an exposure tool 300 (i.e., a lithographic exposure tool) and measurement of the shift of the printed image in a metrology tool 400 is schematically illustrated. The lithographic exposure tool 310 can include a polarized light source 310. A reticle 102 according to one of the embodiments of the present disclosure can be loaded into the lithographic exposure tool 310. The reticle 102 can include the first exemplary dose and focus monitor structure 302 or the second exemplary dose and focus monitor structure 402 described above. A photoresist layer 420 on a substrate 109 is lithographically exposed in the exposure tool 300 employing the reticle 102 and at a setting in which the photoresist layer 420 is maintained at a distance from the lens 330 of the exposure tool 300. The vertical distance between a photoresist layer 420 on a substrate 109 and the lens 330 of the exposure tool 300 is set at a fixed distance during the lithographic exposure of the photoresist layer 420. The photoresist layer 420 is subsequently developed.

Subsequently, the substrate 109 with a developed photoresist layer 420 includes printed images 9 of the dose and focus monitor structure. A dose offset and a focus offset of the lithographic system can be simultaneously measured. Specifically, the first offset distance ΔX1 and the second offset distance ΔF2 along with the direction of the vectors (See FIG. 3) defining the first offset distance ΔX1 and the second offset distance ΔF2 can be employed to determine the magnitude and the sign of the dose offset and the focus offset. Alternatively or additionally, the magnitude and the direction of the shift of the geometrical center GC of each third or forth unit dose monitor (180A, 180B) can be measured to determine the magnitude and the sign of the dose offset in the lithographic process. Alternatively or additionally, the magnitude and the direction of the shift of the geometrical center of each third or fourth unit focus monitor (280A, 280B) can be measured to determine the magnitude and the sign of the focus offset in the lithographic process. The measured data on the focus offset can be provided to an automated process control (APC) system to control the focus offset of the lithographic exposure tool in subsequent lithographic exposure of additional substrates with a photoresist layer thereupon.

Each pair of unit dose monitors in the second exemplary dose and focus monitor structure can provide a differential measurement because the direction of movement of geometrical centers GC in the pair of printed shapes are opposite in the pair of unit dose monitors. Within each pair of unit dose monitors, each unit dose monitor functions as a complementary unit dose monitor with respect to the other unit dose monitor to enable differential measurements. Each pair of unit focus monitors in the second exemplary dose and focus monitor structure can provide a differential measurement because the direction of movement of geometrical centers GC in the pair of printed shapes are opposite in the pair of unit focus monitors. Within each pair of unit focus monitors, each unit focus monitor functions as a complementary unit focus monitor with respect to the other unit focus monitor to enable differential measurements.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A reticle comprising a dose and focus monitor structure, said dose and focus monitor structure comprising:
   at least one pair of unit dose monitors configured to print a first pair of printed shapes on a photoresist layer, upon lithographic exposure and development of said photoresist layer, said first pair of first printed shapes moving in opposite directions from positions corresponding to a nominal dose by a first offset distance that is proportional to a dose offset from said nominal dose; and
   at least one pair of unit focus monitors configured to print a second pair of printed shapes on said photoresist layer, upon lithographic exposure and development of said photoresist layer, said second pair of second printed shapes moving in opposite directions from positions corresponding to a nominal focus by a second offset distance that is proportional to a focus offset from said nominal focus,
   wherein a pair of unit dose monitors among said at least one pair of unit dose monitors have patterns that are mirror images of each other.

2. The reticle of claim 1, wherein a mirror image axis for generating a pattern that is congruent to one of said pair of unit dose monitors from a pattern of another of said pair of unit dose monitors is perpendicular to a direction of said first offset distance.

3. The reticle of claim 1, wherein a pair of unit focus monitors among said at least one pair of unit focus monitors have patterns that are mirror images of each other.

4. The reticle of claim 3, wherein a mirror image axis for generating a pattern that is congruent to one of said pair of unit focus monitors from a pattern of another of said pair of unit focus monitors is perpendicular to a direction of said second offset distance.

5. The reticle of claim 1, wherein each of said unit dose monitors comprises a set of graded-width structures having a monotonically decreasing width and configured to generate a line edge on said photoresist layer, said line edge shifting as a function of said dose offset.

6. The reticle of claim 1, wherein each of said unit dose monitors comprises a plurality of sets of graded-width structures, wherein each graded-width structure has a monotonically decreasing width, and each set of graded-width structures is configured to generate, on said photoresist layer, a line edge that shifts as a function of said dose offset, and said plurality of sets of graded-width structures generate, on said photoresist layer, two line edges that are perpendicular to each other and shift as a function of said dose offset.

7. The reticle of claim 6, wherein each of said unit dose monitors comprises four sets of graded-width structures configured to generate, on said photoresist layer, four rectangular shapes, wherein a geometrical center of said four rectangular shapes moves, in proportion to said dose offset, along a direction that is at a 45 degree angle with respect to lengthwise edges of said four rectangular shapes.

8. The reticle of claim 1, wherein each of said unit focus monitors comprises a combination of a rectangular block, a first grating, and a second grating, said first grating including a set of lines that are parallel to a lengthwise direction of said rectangular block and located on one side of said rectangular block, and said second grating including a set of lines that are perpendicular to said lengthwise direction of said rectangular block and located on another side of said rectangular block, wherein line edges corresponding to lengthwise sides of said rectangular block shift as a function of said focus offset.

9. The reticle of claim 1, wherein each of said unit focus monitors comprises a plurality of combinations of shapes, each combination of shapes including a rectangular block, a first grating, and a second grating, said first grating including a set of lines that are parallel to a lengthwise direction of said rectangular block and located on one side of said rectangular block, and said second grating including a set of lines that are perpendicular to said lengthwise direction of said rectangular block and located on another side of said rectangular block, wherein line edges corresponding to lengthwise sides of said rectangular block shift as a function of said focus offset, wherein each line edge corresponding to a lengthwise side of said rectangular blocks shifts as a function of said focus offset.

10. The reticle of claim 9, wherein each of said unit focus monitors comprises four combinations of shapes configured to generate, on said photoresist layer, four rectangular shapes, wherein a geometrical center of said four rectangular shapes moves, in proportion to said focus offset, along a direction that is at a 45 degree angle with respect to lengthwise edges of said four rectangular shapes.

11. A method of monitoring a dose and focus of a lithographic process, said method comprising:
lithographically exposing and developing a photoresist layer on a substrate employing a reticle, said reticle including a dose and focus monitor structure that comprises:
at least one pair of dose monitors configured to print a first pair of edges on a photoresist layer, upon lithographic exposure and development of said photoresist layer, said first pair of edges moving in opposite directions from positions corresponding to a nominal dose by a first offset distance that is proportional to a dose offset from said nominal dose; and
at least one pair of focus monitors configured to print a second pair of edges on said photoresist layer, upon lithographic exposure and development of said photoresist layer, said second pair of edges moving in opposite directions from positions corresponding to a nominal focus by a second offset distance that is proportional to a focus offset from said nominal focus;
measuring said first offset distance and said second offset distance from patterns in said lithographically exposed and developed photoresist layer; and
determining said dose offset and said focus offset from said first offset distance and said second offset distance,
wherein a pair of unit dose monitors among said at least one pair of unit dose monitors have patterns that are mirror images of each other, or
wherein a pair of unit focus monitors among said at least one pair of unit focus monitors have patterns that are mirror images of each other.

12. The method of claim 11, wherein a mirror image axis for generating a pattern that is congruent to one of said pair of unit dose monitors from a pattern of another of said pair of unit dose monitors is perpendicular to a direction of said first offset distance.

13. The method of claim 11, wherein a mirror image axis for generating a pattern that is congruent to one of said pair of unit focus monitors from a pattern of another of said pair of unit focus monitors is perpendicular to a direction of said second offset distance.

14. The method of claim 11, wherein each of said unit dose monitors comprises a set of graded-width structures having a monotonically decreasing width and configured to generate a line edge on said photoresist layer, said line edge shifting as a function of said dose offset.

15. The method of claim 11, wherein each of said unit dose monitors comprises a plurality of sets of graded-width structures, wherein each graded-width structure has a monotonically decreasing width, and each set of graded-width structures is configured to generate, on said photoresist layer, a line edge that shifts as a function of said dose offset, and said plurality of sets of graded-width structures generate, on said photoresist layer, two line edges that are perpendicular to each other and shift as a function of said dose offset.

16. The method of claim 11, wherein each of said unit focus monitors comprises a combination of a rectangular block, a first grating, and a second grating, said first grating including a set of lines that are parallel to a lengthwise direction of said rectangular block and located on one side of said rectangular block, and said second grating including a set of lines that are perpendicular to said lengthwise direction of said rectangular block and located on another side of said rectangular block, wherein line edges corresponding to lengthwise sides of said rectangular block shift as a function of said focus offset.

17. The method of claim 11, wherein each of said unit focus monitors comprises a plurality of combinations of shapes, each combination of shapes including a rectangular block, a first grating, and a second grating, said first grating including a set of lines that are parallel to a lengthwise direction of said rectangular block and located on one side of said rectangular block, and said second grating including a set of lines that are perpendicular to said lengthwise direction of said rectangular block and located on another side of said rectangular block, wherein line edges corresponding to lengthwise sides of said rectangular block shift as a function of said focus offset, wherein each line edge corresponding to a lengthwise side of said rectangular blocks shifts as a function of said focus offset.

18. A reticle comprising a dose and focus monitor structure, said dose and focus monitor structure comprising:
at least one pair of unit dose monitors configured to print a first pair of printed shapes on a photoresist layer, upon lithographic exposure and development of said photoresist layer, said first pair of first printed shapes moving in opposite directions from positions corresponding to a nominal dose by a first offset distance that is proportional to a dose offset from said nominal dose; and
at least one pair of unit focus monitors configured to print a second pair of printed shapes on said photoresist layer, upon lithographic exposure and development of said photoresist layer, said second pair of second printed shapes moving in opposite directions from positions corresponding to a nominal focus by a second offset distance that is proportional to a focus offset from said nominal focus,
wherein a pair of unit focus monitors among said at least one pair of unit focus monitors have patterns that are mirror images of each other.

* * * * *